Dec. 8, 1970 R. K. RIEL ET AL 3,546,542

INTEGRATED HIGH VOLTAGE SOLAR CELL PANEL

Filed Jan. 30, 1967 2 Sheets-Sheet 1

WITNESSES

Donald M. Winegar

Wm. B. Sellers

INVENTORS

Robert K. Riel, Krishan S. Tarneja, Frederick G. Ernick, & Paul M. Kisinko

BY

C. L. Menzemer

ATTORNEY

INTEGRATED HIGH VOLTAGE SOLAR CELL PANEL

United States Patent Office 3,546,542
Patented Dec. 8, 1970

3,546,542
INTEGRATED HIGH VOLTAGE SOLAR CELL PANEL

Robert K. Riel, Greensburg, Krishan S. Tarneja, Pittsburgh, Frederick G. Ernick, Youngwood, and Paul M. Kisinko, Greensburg, Pa., assignors to Westinghouse Electric Corporation, Pittsburgh, Pa., a corporation of Pennsylvania Filed Jan. 30, 1967, Ser. No. 612,482
Int. Cl. H01l 15/04
U.S. Cl. 317—234 7 Claims

ABSTRACT OF THE DISCLOSURE

This invention relates to high voltage solar cell panels. A body of semiconductor material is employed as a continuous substrate upon which an epitaxial layer is grown. The epitaxial layer is divided into a plurality of isolated areas effectively resulting in individual solar cells. The solar cells are then electrically joined together by evaporated metal electrical contacts to form a high voltage solar cell panel.

BACKGROUND OF THE INVENTION

Field of invention

Figure 1:
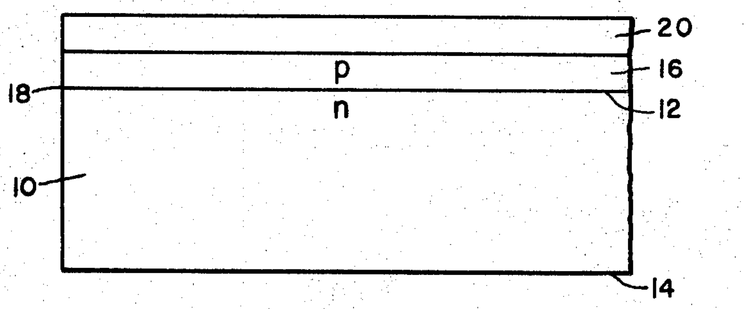

This invention relates to solar cell panels and in particular to high voltage solar cell panels wherein each solar cell of one panel is formed from a mutually common substrate.

Description of prior art

Heretofore, several methods have been employed to produce high voltage solar cell panels. One method is a straightforward approach of making a plurality of individual solar cells and then mounting and electrically connecting them in a series array to obtain the desired voltage. Objections to this method are the problems associated with individual handling and the external electrical connections employed. Each individual cell would have to be matched with the other cells in the panel array. Also every solder connection is a source of potential electrical failure.

A second method employs the teachings of physically removing portions of the p-n junctions to form isolated active surface areas. However, resolution is poor and processing difficult since a closely controlled etch is required to expose the lower contact region. Additionally external electrical leads are required with their inherent potential source of failure. Also, some form of protection should be provided for the exposed portions of the p-n junction to prevent localized shorting across the p-n junction.

SUMMARY OF THE INVENTION

This invention provides a solar cell panel comprising a substrate of a semiconductor material of a first type semiconductivity, a plurality of spaced diodes joined to the top surface of the substrate, a p-n junction between each diode and the substrate, a plurality of bodies of a semiconductor material disposed between adjacent diodes, a p-n junction between each of the bodies and the adjacent diodes, a layer of silicon oxide disposed on at least a portion of the top surface of the panel, and metal electrical contacts disposed on the top surface of the panel and connecting the diodes in a series circuit relationship.

An object of this invention is to provide a high voltage solar cell panel which overcomes the objections and the deficiencies of prior art high voltage solar cell panels.

Another object of this invention is to provide a high voltage solar cell panel comprising a continuous body of semiconductor material.

A further object of this invention is to provide a high voltage solar cell panel wherein one region of semiconductivity of each solar cell in the panel is formed by a portion of a continuous body of semiconductor material and each solar cell is isolated from each other without removing any material comprising the p-n junction of each cell or any material of the substrate.

A further object of this invention is to provide a high voltage solar cell panel wherein evaporated metal electrical contacts connect each adjacent solar cell to each other electrically.

Other objects of this invention will, in part, be obvious and will, in part, appear hereinafter.

DRAWINGS

For a better understanding of the nature and the objects of this invention, reference should be had to the following drawings in which FIGS. 1 through 6 are views of a body of semiconductor material being processed in accordance with the teachings of this invention.

DESCRIPTION OF THE INVENTION

With reference to FIG. 1 there is shown a body 10 of semiconductor material suitable for use in making integrated high voltage solar cell panel. The body 10 has a major top surface 12 which is substantially parallel to a major bottom surface 14.

The material comprising the body 10 is one selected from the group of semiconductor materials consisting of silicon, silicon carbide, germanium, compounds of Group III and Group V elements and compounds of Group II and Group VI elements.

A piece of semiconductor material in the form of a web dendrite is particularly suitable for comprising the body 10. More particularly, the body 10 of semiconductor material is at least one centimeter in width and 30 centimeters in length. The body 10 is from 4 mils to 20 mils in thickness with 6 mils being preferred.

The body 10 has a resistivity of from 1 ohm-centimeter to 20 ohm-centimeters. A resistivity of 10 ohm-centimeters is preferred.

For purpose of illustration only, and for no other reasons, the body 10 will be described as a portion of n-type semiconductivity silicon web dendritic material one centimeter in width, 30 centimeters in length, 10 mils in thickness and havng a resistivity of 10 ohm-centimeters.

A layer 16 of p-type semiconductivity silicon is epitaxially grown on the surface 12 of the body 10. Any suitable method known to those skilled in the art may be practiced to form the layer 16 since the process of how the epitaxial growth occurs on the surface 12 forms no part of this invention. The layer 16 preferably is suitably doped with either boron or aluminum to produce the p-type semiconductivity and to establish a resistivity of from 1 to 20 ohm-centimeters. A resistivity of 4 ohm-centimeters is preferred.

The layer 16 may be from 10 to 40 microns in thickness. Preferably, the layer 16 should be 25 microns in thickness.

The growing of the epitaxial layer 16 of p-type silicon forms a p-n junction 18 at the interface between the body 10 and the layer 16.

A layer 20 of silicon oxide is formed on the layer 16. The layer 20 is from 10,000 to 12,000 A. in thickness. The layer 20 may be formed by heating the body 10 with the epitaxial layer 16 grown on its surface 12 at a temperature of approximately 1200° C. in a furnace having a steam atmosphere for approximately one hour. The layer 20 acts as a masking layer for the subsequent diffusion process which is to be practiced.

The entire upper surface of the layer 20 of silicon oxide is covered with a suitable masking material. Employing the well known photoresist technique one exposes the masking material to a light source thereby hardening the material of the mask in those areas which will protect the material of the layer 20 beneath them. The unhardened photoresist material is washed away to expose surface areas of the layer 20.

The unprotected silicon oxide of the layer 20 is removed by chemical etching to expose the regions for isolation diffusion. The remaining photoresist material is then removed from the silicon oxide layer 20.

Figure 2:
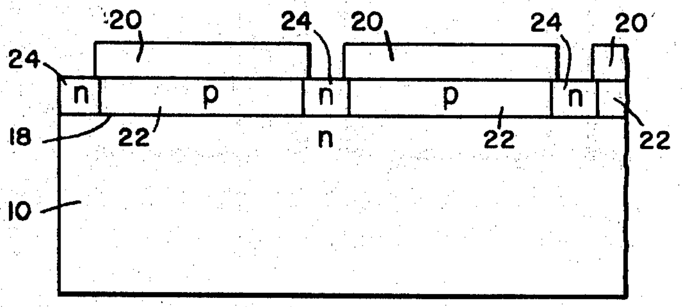
Figure 3:
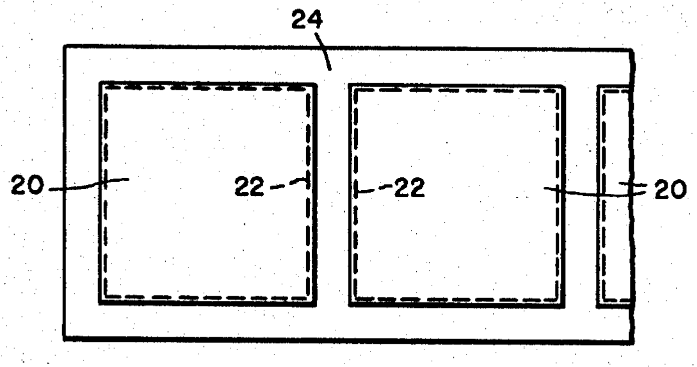

An n-type doping material, such, for example, as phosphorus, is then diffused through the unprotected surfaces and into the layer 20. The n-type doping material is diffused through the entire layer 20 thereby dividing the layer 20 into regions 22 of p-type semiconductivity enclosed by regions 24 of n-type semiconductivity. The resulting structure is as shown in FIGS. 2 and 3. One suitable means of accomplishing this resulting structure is to carry out an open tube diffusion process in which phosphorus oxychloride is the source material for the required elemental phosphorus doping material. A process time of one hour at 1150° C.±5° C. followed by a diffusion drive time of 24 hours at approximately 1200° C. has been found sufficient to form the n-type regions 24.

During the process of diffusing the phosphorus into the layer 18, a silicon oxide layer 26 is formed on each n-type region 24.

Figure 4:
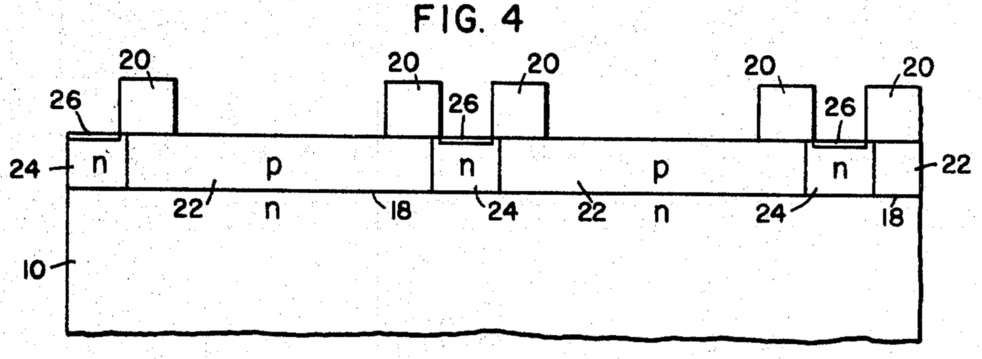

A second masking layer of photoresist material is then disposed on surfaces of the silicon oxide layers 20 and 26. The masking layer is employed to protect all surfaces except that portion of the silicon oxide layer 20 immediately above all but an outer peripheral portion of each p-type region 22. The unprotected silicon oxide of the layer 20 is removed by chemical etching to expose the surface of each p-type region 22 beneath the removed material. The resulting structure is shown in FIG. 4.

Figure 5:
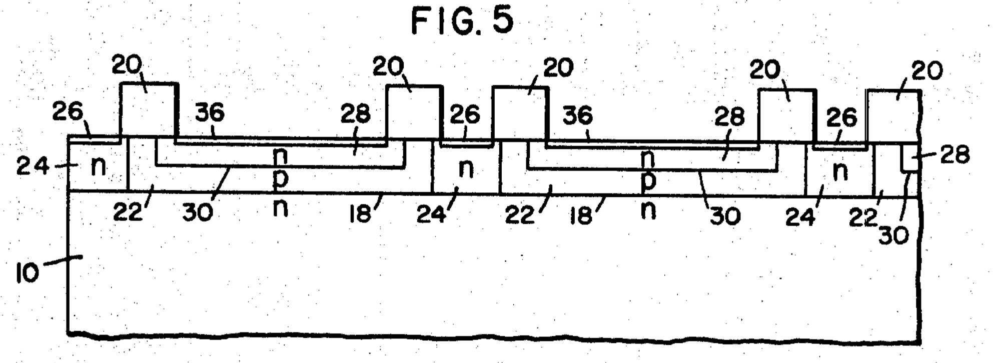

With reference to FIG. 5 an n-type material, such for example, as phosphorus, is then diffused into each region 22 of p-type material. One suitable method employs the open tube diffusion process in which the source of phosphorus is phosphorus pentoxide heated to 250° C. in an oxygen atmosphere. The body 10, including all other materials disposed thereon, is heated to 900° C. The diffusion process is continued for 15 minutes. This is sufficient to drive the phosphorus into the p-type region to a depth of approximately one micron forming a region 28 of n-type semiconductivity in each p-type region 22 and a p-n junction 30 between the regions 22 and 28. The diffusion process drives the phosphorus sideways as well as down into the p-type regions 26 and therefore the p-n junction 30 terminates in the surface of the region 26 beneath the silicon oxide layer 20. Also during the diffusion process, the oxygen atmosphere oxidizes the surface material of each region 28 converting it into a thin layer 36 of silicon oxide.

Figure 6:
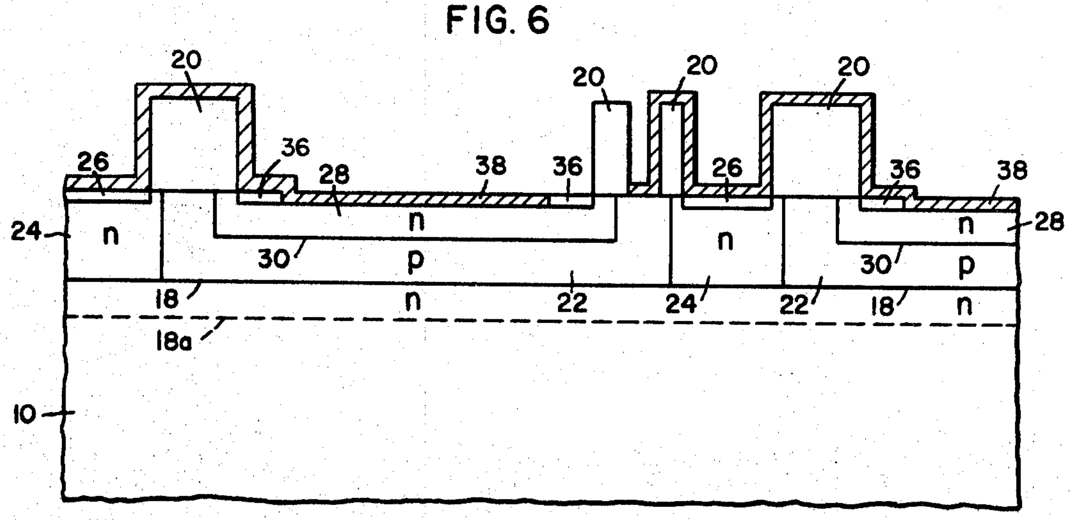

Referring now to FIG. 6 and employing a photoresist masking technique followed by a chemical etching process, all the layer 36 of silicon oxide, except for an outer peripheral portion one edge of which is coextensive with one edge of the layer 20 of silicon oxide, is removed to expose the surface of the n-type region beneath. At the same time selective portions of the remaining material comprising the layer 20 are removed to expose a surface area of each p-type region 22.

A layer 38 of metal electrical contact material is then disposed on the surfaces of the silicon oxide layers 20, 26 and 36, the surface of each n-type region 28, and the surface of each p-type region 22. Any suitable means of metal deposition known to those skilled in the art, such for example as metal vapor deposition in a vacuum evaporation chamber may be employed. The layer 38 may be from 5000 A. to 50,000 A. in thickness. A thickness of 15,000 A. is preferred. The metal comprising the layer 38 may be any suitable electrical contact metal. Preferably aluminum or an alloy of titanium and silver comprise the layer 38.

Utilizing a suitable contact mask, all excess contact metal is removed leaving the structure of the processed body 10 as shown in FIG. 6.

The final structure of the processed body 10 therefore forms a solar cell panel in which the starting substrate material forms the support for the panel. The isolation between each adjacent pair of solar cells is provided by the diffused region 24 in the epitaxial layer 16. Where each p-n junction 18 and 30 has exposed surfaces they are protected by the silicon oxide layer 20. To further isolate each cell electrically from each other the layer 36 of silicon oxide forms a protective insulating layer over the outer peripheral portion of each region 28 of each solar cell. The panel only requires two solder electrical connections to be made. One is made initially to the n-type region 28 of the first cell and the second connection is made to the p-type region 22 of the last solar cell of the series array.

One easily sees therefore that the panel is mechanically strong since no material has been removed from either the body 10 or the epitaxial layer 16. All exposed areas of p-n junctions are protected by silicon oxide layers formed during processing. No additional processing is required.

The advantages of this new solar cell panel over prior art devices are several. First, only two solder electrical connections are required reducing therefore the possibility of potential electrical failure. Each soldered connection between adjacent cells in prior art panels was a potential source of failure. Second, where a panel consisted of a plurality of individual solar cells, electrically connected together, each individual cell had to be matched with the other cells in the same panel. Third, the elimination of a back contact eliminates the need for an isolated substrate for each solar cell.

Other suitable substrate materials are sapphire and quartz. However when one desires a balance between costs, ease of manufacture, quality of the finished product and acceptable working efficiency of the completed panel, it is preferred that presently available silicon webbed dendritic material should be employed as the starting substrate for the solar cell panel.

During normal operations of a solar cell panel made in accordance with the teachings of this invention, the p-n junction 18 floats. That is, the p-n junction 18 appears to move down into the body 10 to a new position 18*a*. Consequently, leakage of generated current in each diode will occur with each neighboring diode. Up to approximately one-half of the theoretically possible electric current expected to be generated in each diode may be lost because of the floating of the p-n junction 18 and other causes. Another potential source of lost electrical current is found in the thickness of the epitaxial layer. At 25 microns in thickness, light will penetrate through into the body 10 and current will be generated and lost from each diode or cell. The average output of each diode, or solar cell, is only 0.4 volt and 4 to 5 milliamps. This is approximately one-half the theoretical output which can be obtained.

While the invention has been described with reference to particular embodiments and examples, it will be understood, of course, that modifications, substitutions and the like may be made therein without departing from its scope.

We claim as our invention:

1. A solar cell panel comprising a substrate;

a plurality of spaced diodes joined to the top surface of the substrate;

a plurality of bodies of a semiconductor material disposed between adjacent diodes;

a p-n junction between each of the bodies and the adjacent diodes;

a layer of silicon oxide disposed on at least a portion of the diodes and the bodies of semiconductor material; and metal electrical contacts disposed on the top surface of the panel and connecting the diodes in a series circuit relationship.

2. The solar cell panel of claim 1 in which the substrate is a material selected from a group consisting of sapphire and quartz.

3. The solar cell panel of claim 1 in which the diodes and the bodies of semiconductor material are formed in an epitaxial layer of semiconductor material grown on the substrate.

4. The solar cell panel of claim 1 in which the substrate is a semiconductor material of a first type semiconductivity and including a p-n junction between each diode and the substrate.

5. The solar cell panel of claim 4 in which the substrate is webbed dendritic material.

6. The solar cell panel of claim 3 in which the substrate is n-type semiconductivity silicon webbed dendritic material having a resistivity of from 1 ohm-centimeter to 20 ohm-centimeters; the epitaxial layer is p-type semiconductivity and from 10 to 40 microns in thickness and having a resistivity of from 1 to 20 ohm-centimeters and the bodies of semiconductor material disposed between adjacent diodes having n-type semiconductivity.

7. The solar cell panel of claim 6 in which the substrate is 6 millimeters in thickness and has a resistivity of 10 ohm-centimeters and the epitaxial layer is 25 microns in thickness and has a resistivity of 4 ohm-centimeters.

References Cited

UNITED STATES PATENTS

| | | | |
|---|---|---|---|
| 2,428,537 | 10/1947 | Veszi | 317—235X |
| 2,919,298 | 12/1959 | Regnier | 317—234X |
| 3,104,188 | 9/1963 | Moncrieff-Yeates | 136—89 |
| 3,117,260 | 1/1964 | Noyce | 317—235 |
| 3,380,153 | 4/1968 | Husher et al. | 29—577 |

JAMES D. KALLAM, Primary Examiner

U.S. Cl. X.R.

317—101, 235